(12) United States Patent  (10) Patent No.: US 9,312,410 B2
Ergun et al.  (45) Date of Patent: Apr. 12, 2016

(54) INAS/ALSB/GASB BASED TYPE-II SL PIN DETECTOR WITH P ON N AND N ON P CONFIGURATIONS

(75) Inventors: Yuksel Ergun, Eskisehir (TR); Mustafa Hostut, Antalya (TR)

(73) Assignee: ASELSAN ELEKTRONIK SANAYI VE TICARET ANONIM SIRKETI, Ankara (TR)

( * ) Notice: Subject to any disclaimer, the term of this patent is extended or adjusted under 35 U.S.C. 154(b) by 0 days.

(21) Appl. No.: 14/411,407

(22) PCT Filed: Jun. 26, 2012

(86) PCT No.: PCT/IB2012/053222
§ 371 (c)(1),
(2), (4) Date: Feb. 10, 2015

(87) PCT Pub. No.: WO2014/001840
PCT Pub. Date: Jan. 3, 2014

(65) Prior Publication Data
US 2015/0179844 A1  Jun. 25, 2015

(51) Int. Cl.
*H01L 29/06* (2006.01)
*H01L 31/0352* (2006.01)
*H01L 21/02* (2006.01)
*H01L 31/105* (2006.01)
*B82Y 20/00* (2011.01)
*H01L 31/0304* (2006.01)
*H01L 31/109* (2006.01)

(52) U.S. Cl.
CPC ......... *H01L 31/035236* (2013.01); *B82Y 20/00* (2013.01); *H01L 21/02398* (2013.01); *H01L 21/02463* (2013.01); *H01L 21/02466* (2013.01); *H01L 21/02507* (2013.01); *H01L 21/02546* (2013.01); *H01L 21/02549* (2013.01); *H01L 21/02576* (2013.01); *H01L 21/02579* (2013.01); *H01L 31/03042* (2013.01); *H01L 31/105* (2013.01); *H01L 31/109* (2013.01)

(58) Field of Classification Search
USPC ..................... 257/21, 184, E33.076
See application file for complete search history.

(56) References Cited

U.S. PATENT DOCUMENTS

| | | | |
|---|---|---|---|
| 6,727,153 B2 * | 4/2004 | Chow | H01L 29/7371 257/197 |
| 2012/0217475 A1 * | 8/2012 | Leavitt | B82Y 20/00 257/14 |

OTHER PUBLICATIONS

Salthoglu Omer et al: "Atomic layer deposited Al passivation of type II InAs/GaSb superlattice photodetectors", Journal of Applied Physics. New York, US, vol. 111, No. 7.

(Continued)

*Primary Examiner* — Timor Karimy
(74) *Attorney, Agent, or Firm* — Gokalp Bayramoglu

(57) ABSTRACT

Novel N-structured In As/Al Sb(Al Ga Sb)/Ga Sb based type-II SL pin detector with p on n and n on p configurations are given to detect light in the Mid Wavelength Infrared Range—MWIR with a cut-off wavelength of 5 μm. Better carrier confinements are performed by placing AlSb layers switching from InAs layers to Ga Sb layers successively in the growth direction throughout the SL pin diode where zero bias detectivity is improved as $6\times10^{13}$ A/Hz$^{1/2}$ at a wavelength of 4.2 μm at 79K. RoA value is measured as $1.8\times10^6$ Ωcm² which is better than nBn devices. Dark current density is also obtained in the range of $4$-$7\times10^{-7}$ A/cm at zero bias and Vb=0.3V respectively at 79K.

28 Claims, 3 Drawing Sheets

(56) References Cited

OTHER PUBLICATIONS

Esaki L et al: "Polytype superlattices and multi-hererojunctions", Japanese Journal of Applied Physics, The Japan Society of Applied Physics.

Tunay Tansel et al: "Effect of Passivation Layer on the Noise Characteristics of Mid-Wave-Infrared InAs/GaSb Superlattice Photodiodes", IEEE Photonics Technology.

Xu W et al: "Band hydridization and spin-splitting in InAs/AlSb/GaSb type II and broken-gap quantum wells", Journal of Applied Physics, American Institute of Physics, American Institute of Physics. New York, US, vol. 108, No. 5, Sep. 8, 2010,pp. 53709-53709,XP012142773, ISSN:0021-8979,DOI :10.1063/1.3476059 pp. 053709-1-053709-2.

* cited by examiner

INAS/ALSB/GASB BASED TYPE-II SL PIN DETECTOR WITH P ON N AND N ON P CONFIGURATIONS

FIELD OF THE INVENTION

The present invention relates to the field of semiconductor assemblies and InAs/AlSb/GaSb (Indium Arsenide/Alumimium Antimonide/Gallium Antimonide) based superlattice infrared detectors.

BACKGROUND OF THE INVENTION

For third generation infrared detector technology, todays rival infrared photon detectors are HgCdTe (Mercury Cadmium Telluride or MCT) photodiodes and Quantum Well Infrared Photodetectors (QWIPs). However, QWIPs have high thermal generation rates causing higher dark currents. Increasing the operating temperatures above 77K, and thermionic emission dominates the dark current which drastically increases noise. The signal to noise ratio is therefore decreased. QWIPs are required to be cooled down to cryogenic temperatures (77K and lower) to be operated. The other types of detectors used in the infrared (IR) range are HgCdTe (Mercury Cadmium Telluride or MCT). MCT has inherent problems of thermal instability and poor compositional uniformity over large areas and it is one of the most difficult materials to be grown and processed due to the low strength of the material and surface uniformity making this option a high cost technology. Micro fabrication QWIPs are difficult since they can not detect direct incidence and grating is required. They have disadvantages due to cooling problems, bulk, volume, cost, and power consumptions. On the other hand, it is difficult to have uniform surface over large areas since MCT has thermal instability, poor compositional uniformity and poor interfaces. These problems originate from weak bonding characteristics of II-IV semiconductors and from Hg vapor pressure. Weak bonding reduces the strength of material, resulting in bad mechanical properties and creates difficulty in processing. Moreover composition control and mechanical problems result in difficulties in material processing and produces focal plane array (FPA).

On the other hand, most promising III-V material group is based on the versatile 6.1 Å (unit cell length) materials family have constituents of GaSb, InAs, AlSb which enables closely lattice matched bulk and superlattice (SL) layers. In type-II SL based infrared detector designs, most commonly used material is InAs/GaSb in a pin (p-type-intrinsic-n-type) detector structure since the type-II material system enables special distributions of InAs and GaSb layers. In such system, conduction band of the InAs stays below the valence band of the GaSb.

The effective band gap of the InAs/GaSb SL is defined as the energy separation between the lowest conduction and the highest valence minibands. The absorption wavelength can be adjusted approximately between 3 to 30 μm by altering layer thickness to cover wavelength range from mid to very long infrared. The type-II inter-band absorption is performed by electrons from conduction band and holes from valence band in the InAs/GaSb interfaces.

It is well known that there are InAs/GaSb (Indium Arsenide/Gallium Antimonide) superlattice pin structures used to detect rays of infrared wavelength and these are used in applications like thermal imaging systems etc. but the conventional InAs/GaSb superlattice pin structures have high surface leakage currents, therefore they require sufficient passivation. Beside these, InAs/GaSb interfaces have some bonding problems causing GR (generation/recombination) and diffusion currents resulting in an increase of dark current density. In the previous InAs/GaSb type-II pin SLs, detectivity decreases since the significant overlap of electron and hole wave functions can not be realized properly and the detectivities reside in the range $2\times10^{10}$-$6\times10^{11}$ cmHz$^{1/2}$/W at 77K.

The current methods with InAs/GaSb type-II pin SLs do not offer better carriers confinement, have high dark current densities, low dynamic resistances, low detectivities, require very low operating temperatures, Additionally, known methods have higher costs, higher operating voltages and require higher power consumption for cooling.

The Chinese patent document CN101562210, an application in the state of the art, discloses a GaAs-based InAs/GaSb superlattice infrared photodetector with a wave band of 3 microns to 5 microns and a manufacturing method thereof wherein GaSb buffer layers are grown on the GaAs substrate, and InAs/GaSb superlattices are grown on the GaSb buffer layers.

The United States patent document US2002125472, an application in the state of the art, discloses a multispectral radiation detector for detecting radiation in at least two spectral bands, comprises at least first and second photodiodes, each photodiode having at least one strain-compensating superlattice absorbing layer substantially lattice matched to adjacent layers of the detector.

The United States patent document US2004142504, an application in the state of the art, discloses a type-II superlattice photon detector, focal planes array and method for making. It is either a binary or tertiary system with a type-II band alignment comprising a system selected from the groups consisting of InAs/GaSb; SiGe; InAs/GaxIn1−xSb; and InAs/GaSb/AlSb.

SUMMARY OF THE INVENTION

An objective of the present invention is to provide a photodetector structure to be operated in the Mid Wavelength Infrared Range (MWIR) having short integration times and low cost, high frame rates, low dark current density, high detectivity, high responsivity, and lower operating voltage at higher operating temperatures.

DETAILED DESCRIPTION OF THE INVENTION

A structure realized to fulfill the objective of the present invention is illustrated in the accompanying figures, in which.

Figure 1:
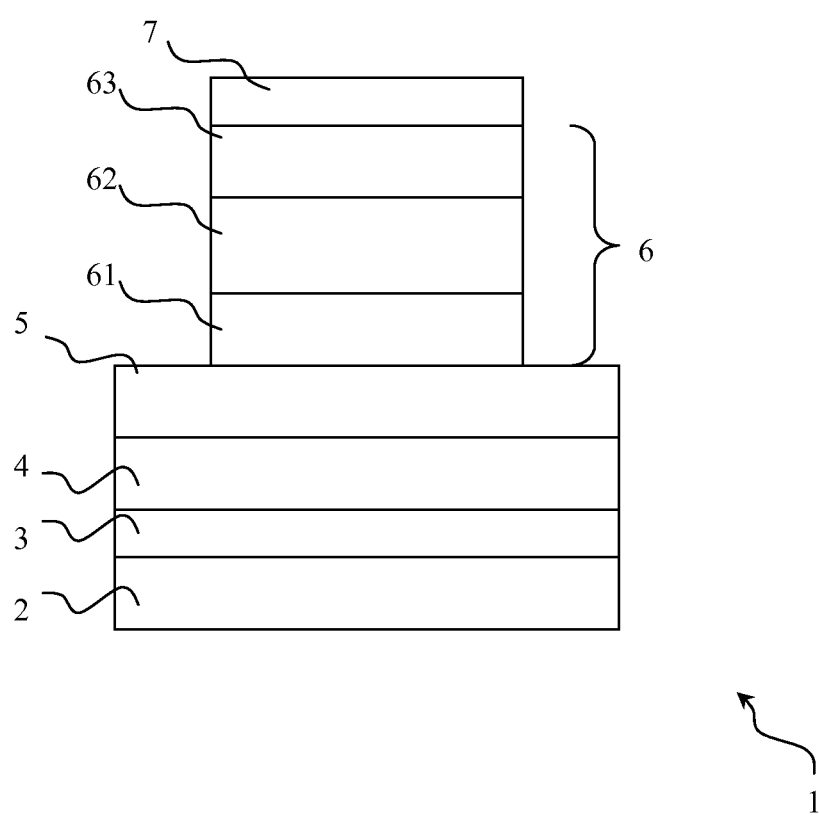
FIG. 1 is the schematic view of the n on p structure.

The components illustrated in the figures are individually numbered where the numbers refer to the following:

1. Novel N-structured InAs/AlSb/GaSb infrared detector structure
2. GaSb substrate
3. GaSb buffer layer
4. Lattice matched AlGaAsSb buffer layer
5. Bottom contact layer 6. Set of InAs/AlSb/GaSb superlattice layers
   61. p-type layer
   62. Active layer
   63. n-type layer
7. Capping layer
E. Electron miniband
H. Heavy-hole miniband A novel N-structured InAs/AlSb/GaSb infrared detector structure (1) to be used as a pixel fundamentally comprises;
  at least one GaSb buffer layer (3) residing on top of a GaSb substrate (2),
  at least one lattice matched AlGaAsSb buffer layer (4) residing on top of GaSb buffer layer (3),
  bottom contact layer (5) residing on top of AlGaAsSb buffer layer (4),
  at least three sets of InAs/AlSb/GaSb superlattice layers (6)—at least one being p-type layer (61), at least one being n-type layer (63), and at least one constituting the active region (62)—residing on top of bottom contact layer (5)

The embodiment of the present invention as n on p design of the detector structure is grown on un-intentionally p-type doped (100) GaSb substrate (2) followed by a 90-110 nm GaSb buffer layer (3). The pin detector structure consists of a lattice matched 15-25 nm $Al_{0.4-0.6}Ga_{0.4-0.6}As_{0.03-0.05}Sb_{0.95-0.97}$ buffer layer (4), and a 900-1100 nm thick with $4\times10^{17}$-$6\times10^{17}$ cm$^{-3}$ Be doped p-type GaSb bottom contact layer (5). The set of InAs/AlSb/GaSb superlattice layers (6) residing on top of this bottom contact (5), includes between 80 to 100 periods of p-type layer (61) consisting of 0.5-1.5 ML InSb/8-11 MLs i-InAs/1.5-2.5 MLs AlSb($Al_{0.7-1}Ga_{0.0-0.3}$ Sb)/6-9 MLs GaSb:Be (p=$4\times10^{17}$-$6\times10^{17}$ cm$^{-3}$) type-II SL wherein 1 ML is defined as the half of unit cell (zinc-blend, lattice constant=a). The active layer (62) includes 80-900 periods of i-intrinsic region consisting of 0.5-1.5 MLs InSb/8-11 MLs i-InAs/1.5-2.5 MLs AlSb ($Al_{0.7-0.1}Ga_{0.0-0.3}$ Sb)/6-9 MLs i-GaSb type-II SL and the n-type layer (63) includes 35-45 periods of n-type layer (63) consisting of 0.5-1.5 ML InSb/8-11 MLs n-InAs:Te(or Si) (n=$4\times10^{17}$-$6\times10^{17}$ cm$^{-3}$)/1.5-2.5 MLs AlSb($Al_{0.7-0.1}Ga_{0.0-0.3}$ Sb)/6-9 MLs i-GaSb type-II SL. In a preferred embodiment n-type layer (63) is on the top and p-type layer (61) is on the bottom. Preferentially at least one capping layer (7) which is Te(Si)-doped (n=$4\times10^{17}$-$6\times10^{17}$ cm$^{-3}$) and 15 to 25 nm thick n-InAs is placed on the very top of the structure. (FIG. 1.)

Figure 2:
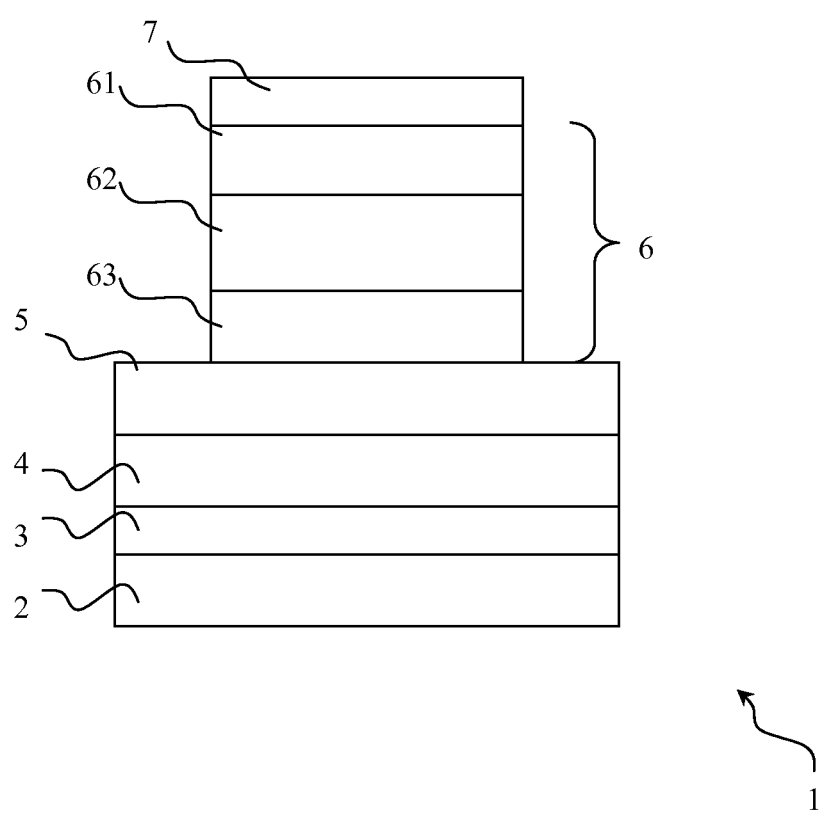
FIG. 2 is the schematic view of the p on n structure.

Most SL based detectors use a bottom p-type GaSb contact layer and a thin n-InAs top contact layer (n on p device). However, most readout integrated circuits (ROICs) that are needed to collect and read out the charge from the pixels in the FPA only work with the p on n polarity (p on n device). In another preferred embodiment, a suitable structure with a cut-off wavelength ($\lambda_c$) of about 5 μm for FPA application is designed as a p on n structure. The detector structure is grown on n-type doped (100) GaSb substrate (2) followed by 90-110 nm GaSb buffer layer (3). The pin detector structure consists of a lattice matched 15-25 nm $Al_{0.4-0.6}Ga_{0.4-0.6}As_{0.03-0.05}Sb_{0.95-0.97}$ buffer layer (4), and a 450-550 nm thick Te(Si) doped (n=$4\times10^{17}$-$6\times10^{17}$ cm$^{-3}$) n-type $InAs_{0.88-0.90}Sb_{0.1-0.11}$ bottom contact layer (5). The set of InAs/AlSb/GaSb superlattice layers (6) residing on top of this bottom contact (5), includes 55 to 65 periods of n-type layer (63) consisting of 0.5-1.5 ML InSb/8-11 MLs n-InAs:Te(Si) (n=$4\times10^{17}$-$6\times10^{17}$ cm$^{-3}$)/1.5-2.5 ML AlSb($Al_{0.7-1}Ga_{0.0-0.3}$Sb)/6-9 ML i-GaSb type-II SL; the active layer (62) includes 80-900 periods of i-intrinsic region consisting of 0.5-1.5 ML InSb/8-11 ML i-InAs/1.5-2.5 ML AlSb($Al_{0.7-1}Ga_{0.0-0.3}$Sb)/6-9 MLs i-GaSb type-II SL; and p-type layer (61) includes 80-100 periods of p-region consisting of 0.5-1.5 ML InSb/8-11 MLs i-InAs/1.5-2.5 ML AlSb($Al_{0.7-1}Ga_{0.0-0.3}$Sb)/6-9 ML p-GaSb:Be (p=$4\times10^{17}$-$6\times10^{17}$ cm$^{-3}$) type-II SL. Preferentially at least one capping layer (7) which is Be-doped (p=$7\times10^{17}$-$9\times10^{17}$ cm$^{-3}$) and 40-50 nm thick p-GaSb is placed on the very top of the structure. In a preferred embodiment n-type layer (63) is on the bottom and p-type layer (61) is on the top. (FIG. 2.)

In the n-on-p or p-on-n devices, to obtain desired cut-off wavelength the thickness of all SL layers [GaSb,InAs,AlSb ($Al_{0.7-1}Ga_{0.0-0.3}$Sb)] vary in between ±2 ML around a center value. In a preferred embodiment, 0.1-0.3 composition of Ga is introduced to AlSb as seen on compositions, to increase exited electron life time under illumination (IR).

Figure 3:
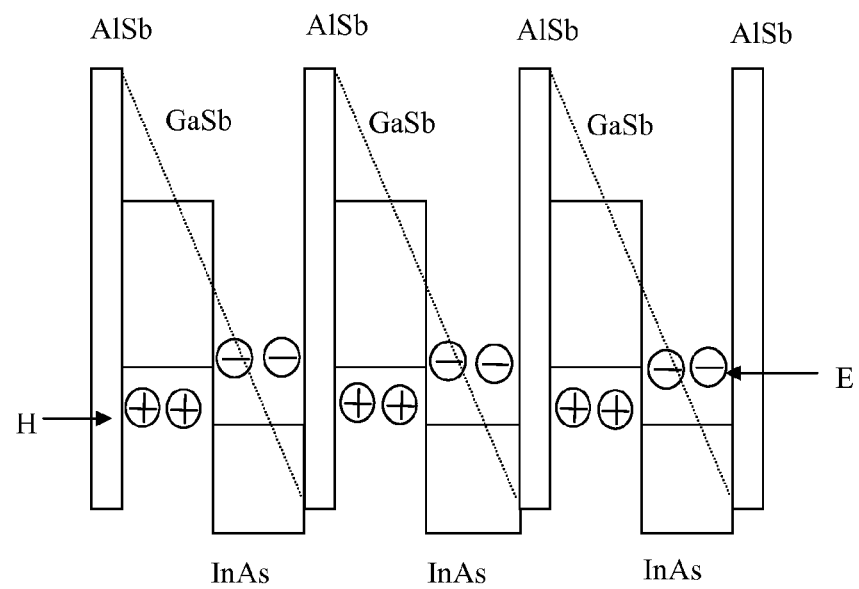
FIG. 3 is the schematic band diagram of the InAs/AlSb/GaSb SL N-structure with electron and heavy hole minibands.

The overall detector parameters are improved by the new design of InAs/AlSb/GaSb based type-II SL pin detector. First, confinement of electron (E) and hole (H) wave functions are performed better in the new design where AlSb layers are placed switching from InAs layers to GaSb layers successively in the growth direction throughout the SL pin diode (FIG. 3). Strong overlap is performed by shifting the electron (E) and hole (H) wave functions to the InAs/GaSb interfaces. Therefore, AlSb layers in the structure results in better confinement of carriers and give rise to strong type-II interband transitions which leads to higher zero bias detectivity. Second, the lattice matched interfaces are also improved by introducing 1 ML of InSb, when transitions from GaSb to InAs layers. Third, the dark current is decreased with the new design. InAs/GaSb based type-II SL detectors are generally operated in cryogenic temperatures due to dark current. In a standard SL pin detector, major sources of dark current are generation-recombination (GR) currents and trap assisted tunnelling currents due to Shockley-Read-Hall centres, diffusion current, and surface leakage currents. However, AlSb in the new design is a large band gap material. Effective mass of electron in AlSb is higher than GaSb leading to a reduction of tunnelling and Auger recombination. Beside this, GR centres in the depletion region cause GR recombination of minority carriers. GR component of dark current is typically several orders of magnitude larger than diffusion current. AlSb containing InAs/GaSb SL in the depletion region suppresses the GR current. As a result, dark current density is suppressed by giving rise to the zero-bias differential resistance. This allows the operation of the detector at higher operating temperatures.

The proposed detector structure taking place in this invention has detectivity of $1\times10^{14}$ cmHz$^{1/2}$/W obtained at 79K. This detectivity value reaches the values of high performance M-structures which have complicated and different interfaces, which are costly in serial productions. The detectivity value measured is higher than the detectivities of the other types of detectors. On the other hand the dark current density is decreased to the range between $4$-$7\times10^{-7}$ A/cm$^2$ which are lower than nBn, pBp, NbIbP photodetectors. Also a $R_oA$ of $1.8\times10^6$ $\Omega$cm$^2$ which is better than the others except M-structures is obtained since the effective mass of electron in AlSb layers is high. New structure (1) has lower weight and volume comparing to conventional detectors and has low power consumption for cooling.

Within the scope of these basic concepts, it is possible to develop a wide variety of embodiments of the inventive "a novel N-structured InAs/AlSb/GaSb infrared detector structure" (1). The invention cannot be limited to the examples described herein; it is essentially according to the claims.

The invention claimed is:
1. A novel N-structured InAs/AlSb/GaSb infrared detector structure to be used as a pixel comprising:

at least one GaSb buffer layer residing on top of a GaSb substrate;

at least one lattice matched AlGaAsSb buffer layer residing on top of GaSb buffer layer;

at least one Be doped p-type GaSb bottom contact layer residing on top of AlGaAsSb buffer layer;

a plurality of sets of InAs/AlSb/GaSb superlattice layers;

at least one p-type layer;

at least one n-type layer; and at least one active region residing on top of a GaSb bottom contact layer.

2. The novel N-structured InAs/AlSb/GaSb infrared detector structure of claim 1, further comprising at least one capping layer placed on a very top of the structure.

3. The novel N-structured InAs/AlSb/GaSb infrared detector structure of claim 2, wherein the thickness of the capping layer ranges from 15 to 25 nm.

4. The novel N-structured InAs/AlSb/GaSb infrared detector structure of claim 2, wherein the thickness of the capping layer ranges from 40 to 50 nm.

5. The novel N-structured InAs/AlSb/GaSb infrared detector structure of claim 2, wherein the capping layer is Te(Si)-doped (n=$4\times10^{17}$-$6\times10^{17}$ cm$^{-3}$) n-InAs.

6. The novel N-structured InAs/AlSb/GaSb infrared detector structure of claim 2, wherein the capping layer is Be-doped (p=$7\times10^{17}$-$9\times10^{17}$ cm$^{-3}$) p-GaSb.

7. The novel N-structured InAs/AlSb/GaSb infrared detector structure of claim 1, wherein the thickness of the GaSb buffer layer is 90-110 nm.

8. The novel N-structured InAs/AlSb/GaSb infrared detector structure of claim 1, wherein the thickness of the AlGaAsSb buffer layer ranges from 15 to 25 nm.

9. The novel N-structured InAs/AlSb/GaSb infrared detector structure of claim 8, wherein the AlGaAsSb buffer layer is in the composition range $Al_{0.4-0.6}Ga_{0.4-0.6}As_{0.03-0.05}Sb_{0.95-0.97}$.

10. The novel N-structured InAs/AlSb/GaSb infrared detector structure of claim 1, wherein a plurality of InAs/AlSb/GaSb superlattice layers comprising between 80 to 100 periods of p-type layer (61).

11. The novel N-structured InAs/AlSb/GaSb infrared detector structure of claim 10, wherein a plurality of InAs/AlSb/GaSb superlattice layers further comprises an active layer consisting of 0.5-1.5 MLs InSb/8-11 MLs i-InAs/1.5-2.5 MLs AlSb($Al_{0.7-1}Ga_{0.0-0.3}$ Sb)/6-9 MLs i-GaSb type-II SL.

12. The novel N-structured InAs/AlSb/GaSb infrared detector structure of claim 10, wherein the InAs/AlSb/GaSb superlattice layers comprise between 80 to 900 periods of i-intrinsic active layer.

13. The novel N-structured InAs/AlSb/GaSb infrared detector structure of claim 10, wherein a plurality of InAs/AlSb/GaSb superlattice layers comprise an n-type layer which is on the top.

14. The novel N-structured InAs/AlSb/GaSb infrared detector structure of claim 10, wherein a plurality of InAs/AlSb/GaSb superlattice layers comprise a p-type layer which is on the bottom.

15. The novel N-structured InAs/AlSb/GaSb infrared detector structure of claim 10 wherein a plurality of InAs/AlSb/GaSb superlattice layers comprise an n-type layer which is on the bottom.

16. The novel N-structured InAs/AlSb/GaSb infrared detector structure of claim 10, wherein a plurality of InAs/AlSb/GaSb superlattice layers comprise a p-type layer which is on the top.

17. The novel N-structured InAs/AlSb/GaSb infrared detector structure of claim 10, wherein a plurality of InAs/AlSb/GaSb superlattice layers comprise a p-type layer (61) consisting of 0.5-1.5 MLs InSb/8-11 MLs i-InAs/1.5-2.5 MLs AlSb($Al_{0.7-1}Ga_{0.0-0.3}$ Sb)/6-9 MLs GaSb:Be (p=$4\times10^{17}$-$6\times10^{17}$ cm$^{-3}$) type-II SL.

18. The novel N-structured InAs/AlSb/GaSb infrared detector structure of claim 10, wherein a plurality of InAs/AlSb/GaSb superlattice layers comprise 35 to 45 periods of n-type layer.

19. The novel N-structured InAs/AlSb/GaSb infrared detector structure of claim 10, wherein a plurality of InAs/AlSb/GaSb superlattice layers comprise an n-type layer consisting of 0.5-1.5 ML InSb/8-11 ML n-InAs:Te(Si) (n=$4\times10^{17}$-$6\times10^{17}$ cm$^{-3}$)/1.5-2.5 MLs AlSb($Al_{0.7-1}Ga_{0.0-0.3}$ Sb)/6-9 MLs i-GaSb type-II SL.

20. The novel N-structured InAs/AlSb/GaSb infrared detector structure of claim 10, wherein a plurality of InAs/AlSb/GaSb superlattice layers comprise 55 to 65 periods of n-type layer.

21. The novel N-structured InAs/AlSb/GaSb infrared detector structure of claim 10, wherein a plurality of InAs/AlSb/GaSb superlattice layers comprise a n-type layer consisting of 0.5-1.5 ML InSb/8-11 MLs n-InAs:Te(Si) (n=$4\times10^{17}$-$6\times10^{17}$ cm$^{-3}$)/1.5-2.5 ML AlSb($Al_{0.7-1}Ga_{0.0-0.3}$ Sb)/6-9 ML i-GaSb type-II SL.

22. The novel N-structured InAs/AlSb/GaSb infrared detector structure of claim 10, wherein a plurality of InAs/AlSb/GaSb superlattice layers comprise a p-type layer consisting of 0.5-1.5 ML InSb/8-11 MLs i-InAs/1.5-2.5 ML AlSb($Al_{0.7-1}Ga_{0.0-0.3}$ Sb)/6-9 ML p-GaSb:Be (p=$4\times10^{17}$-$6\times10^{17}$ cm$^{-3}$) type-II SL.

23. The novel N-structured InAs/AlSb/GaSb infrared detector structure of claim 1, wherein the bottom contact layer thickness ranges from 900-1100 nm.

24. The novel N-structured InAs/AlSb/GaSb infrared detector structure of claim 1, wherein the GaSb substrate is an un-intentionally p-type doped GaSb.

25. The novel N-structured InAs/AlSb/GaSb infrared detector structure of claim 23, wherein the bottom contact layer is a $4\times10^{17}$-$6\times10^{17}$ cm$^{-3}$ Be doped p-type GaSb.

26. The novel N-structured InAs/AlSb/GaSb infrared detector structure of claim 1, wherein a GaSb substrate is an n-type doped GaSb.

27. The novel N-structured InAs/AlSb/GaSb infrared detector structure of claim 1, wherein the thickness of the bottom contact layer ranges from 450 to 550 nm.

28. The novel N-structured InAs/AlSb/GaSb infrared detector structure of claim 10, wherein the bottom contact layer is a Te(Si) doped (n=$4\times10^{17}$-$6\times10^{17}$ cm$^{-3}$) n-type $InAs_{0.88-0.90}Sb_{0.10-0.11}$.

* * * * *